United States Patent
Ogle, Jr. et al.

(10) Patent No.: US 7,964,905 B1
(45) Date of Patent: Jun. 21, 2011

(54) ANTI-REFLECTIVE INTERPOLY DIELECTRIC

(75) Inventors: Robert B. Ogle, Jr., San Jose, CA (US); Marina V. Plat, San Jose, CA (US); Mark T. Ramsbey, Sunnyvale, CA (US)

(73) Assignee: Spansion LLC., Sunnyvale, CA (US)

( * ) Notice: Subject to any disclaimer, the term of this patent is extended or adjusted under 35 U.S.C. 154(b) by 1690 days.

(21) Appl. No.: 09/591,266

(22) Filed: Jun. 9, 2000

Related U.S. Application Data

(60) Provisional application No. 60/179,291, filed on Jan. 31, 2000.

(51) Int. Cl.
  *H01L 29/94* (2006.01)
(52) U.S. Cl. ............... 257/314; 257/320; 257/E23.001
(58) Field of Classification Search ............... 438/257, 438/266, 261; 257/314, 315, 320, E23.001
See application file for complete search history.

(56) References Cited

U.S. PATENT DOCUMENTS 5,780,891 A * 7/1998 Kauffman et al. ............ 257/316
5,888,870 A * 3/1999 Gardner et al. ............... 438/261

* cited by examiner

*Primary Examiner* — Jack Chen
(74) *Attorney, Agent, or Firm* — Farjami & Farjami LLP

(57) ABSTRACT

The invention provides core stacks for flash memory with an anti-reflective interpoly dielectric. Instead of requiring an anti-reflective coating at the top of the a stack, the present invention uses the interpoly layer as an anti-reflective coating in conjunction with a transmissive second polymer layer. Light is transmitted through the transmissive second polymer layer to the anti-reflective interpoly dielectric layer. The transmissive second polymer layer is formed from an amorphous silicon or polysilicon. Silicon oxynitride (SiON), as formed in the present invention, having a good dielectric constant K, is tailored in its index of refraction and in its thickness for utilization as both a good interpoly material and an anti-reflective coating.

7 Claims, 1 Drawing Sheet

ANTI-REFLECTIVE INTERPOLY DIELECTRIC

RELATED APPLICATION

This application is related to co-pending U.S. Provisional Patent Application Ser. No. 60/179,291, entitled "ANTI-REFLECTIVE INTERPOLY DIELECTRIC," filed Jan. 31, 2000.

TECHNICAL FIELD

The present invention relates to the manufacture of semiconductor devices. More specifically, the present invention relates anti-reflective coatings used in the flash memory semiconductor devices.

BACKGROUND OF THE INVENTION

In the production of semiconductor devices, an anti-reflective coating is used to cut down on light scattering from a surface into a resist mask. By reducing the scattered light, anti-reflective coatings allow for superior patterning and better defining small images. In addition, anti-reflective coatings minimize standing wave effects, such minimization improving the image contrast. In conventional flash memory devices, anti-reflective coatings are placed on the top of core stacks, where additional processing is required to place the anti-reflective coating on the core stacks. FIG. 1 is a cross sectional view of a conventional core stack 10 mounted on a substrate 12 used in prior art flash memory. The core stack 10 comprises a tunnel oxide layer 14 on the substrate 12, a first polysilicon layer 16 formed over the tunnel oxide layer 14, a interpoly layer 18 formed over the first polysilicon layer 16, a second polysilicon layer 20 formed over the interpoly layer 18, and an anti-reflective coating 22 formed over the second polysilicon layer. In the related art, the interpoly layer 18 is made of three layers, which are a first oxide layer 24 on the first polysilicon layer 16, a nitride layer 26 on the first oxide layer 24, and a second oxide layer 28 between the nitride layer 26 and the second polysilicon layer 20 and is called the oxide-nitride-oxide (ONO) layer. The ONO layer forms a dielectric layer, which in the prior art is between about 200 to 300 Å thick. Thus, to obtain the benefits of the anti-reflective coating, without the additional processing steps required for an anti-reflective coating, would be desirable.

BRIEF SUMMARY OF THE INVENTION

It is an object of the invention to provide the benefits of an anti-reflective coating on the core stacks, without the additional processing steps required by an anti-reflective coating. Accordingly, the foregoing objects are accomplished by forming an interpoly dielectric layer that has anti-reflective properties. Other features of the present invention are disclosed or apparent in the section entitled "DETAILED DESCRIPTION OF THE INVENTION."

BRIEF DESCRIPTION OF DRAWINGS

For a fuller understanding of the present invention, the accompanying drawings are below referenced.

Reference numbers refer to the same or equivalent parts of the present invention throughout the several figures of the drawings.

DETAILED DESCRIPTION OF THE INVENTION AND BEST MODE OF THE INVENTION

Figure 1:
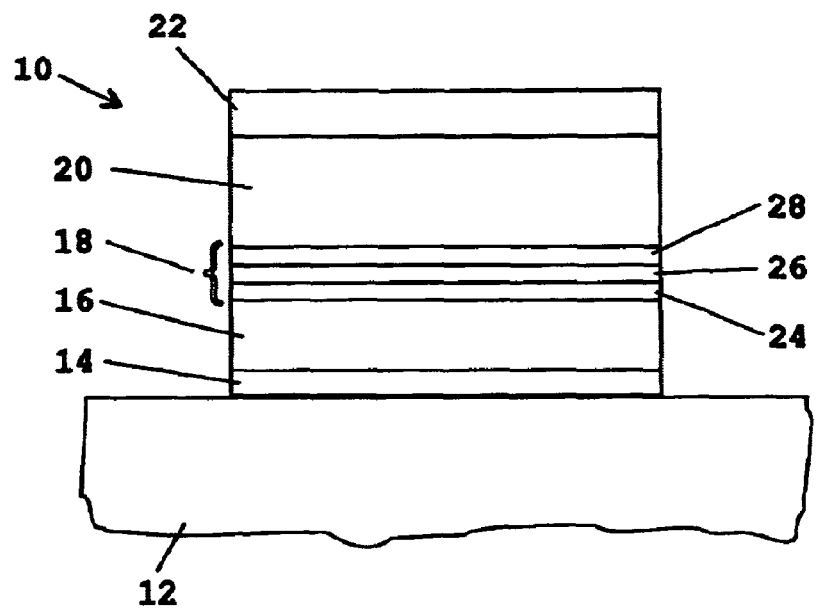
FIG. 1 is a cross sectional view of a flash memory core stack used in the related art.
Figure 2:
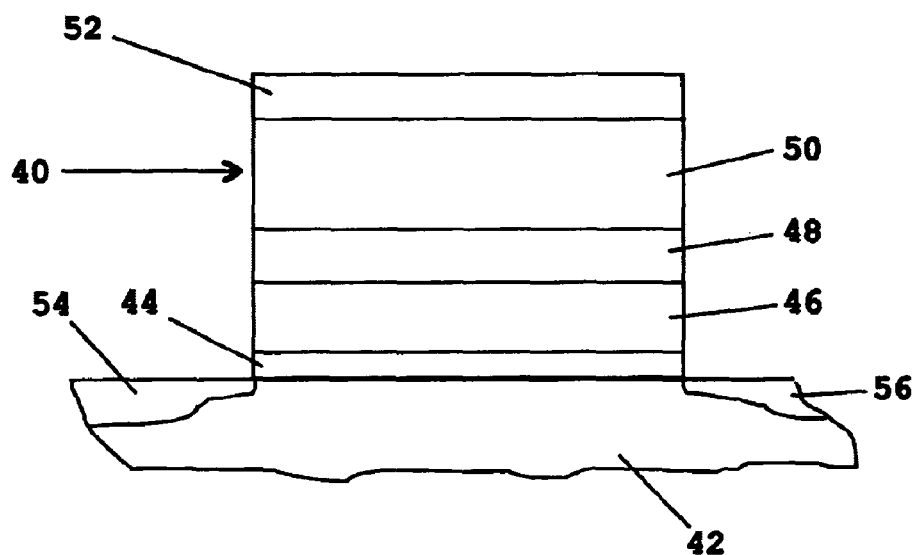
FIG. 2 is a cross sectional view of a flash memory core stack of a preferred embodiment of the invention.

FIG. 2 is a cross sectional view of a core stack 40 of a flash memory device mounted on a substrate 42 in a preferred embodiment of the invention. The core stack 40 comprises a tunnel oxide layer 44 on the substrate 42, a first polysilicon layer 46 formed over the tunnel oxide layer 44, an anti-reflective interpoly layer 48 formed over the first polysilicon layer 46, and a transmissive second polysilicon layer 50 formed over the anti-reflective interpoly layer 48. In the preferred embodiment of the invention, the anti-reflective interpoly layer 48 is formed by a silicon oxynitride (SiON) layer which is between about 300 to 400 Å thick. In the preferred embodiment of the invention, the transmissive second polysilicon layer 50 may be made of either polysilicon on amorphous silicon.

In operation, a photoresist layer 52 is placed over the substrate 42 and core stack 40. A light source with a wavelength $\lambda_1$ is applied to the resist, where the resist reacts to light with a wavelength $\lambda_1$. The polysilicon or amorphous silicon of the transmissive second polysilicon layer 50 is largely transparent to light of the wavelength $\lambda_1$ allowing the light to pass through the transmissive second polysilicon layer 50 to the anti-reflective interpoly layer 48. The anti-reflective interpoly layer 48 has an index of refraction n. Using the equation for anti-reflective coatings:

$$2dn = \left(m + \frac{1}{2}\right)\lambda$$

where d is the thickness of the coating, and where m is the integer number of wavelengths. The equation for the thickness of the anti-reflective interpoly layer 48 is then:

$$d = \frac{\left(m + \frac{1}{2}\right)\lambda_1}{2n}.$$

For m=0, $$d = \frac{\lambda_1}{4n}.$$

With film thickness d and index of refraction n meeting the above equation, light of wavelength $\lambda_1$ is transmitted through the transmissive second polysilicon layer 50 to the anti-reflective interpoly layer 48. For light of wavelength $\lambda_1$, the anti-reflective interpoly layer 48 may be tailored in its thickness d and its index of refraction n to minimize reflection, as is claimed in the present invention. The anti-reflective interpoly layer 48 reduces the amount of light that is reflected, thus allowing for a more detailed imaging of the photoresist layer 52. The photoresist layer 52 is then etched to open apertures in the photoresist layer 52 above source regions and drain regions. A dopant is then implanted to form the source regions 54 and drain regions 56. In use as a flash memory, the anti-reflective interpoly layer 48 has the proper dielectric constant K value to allow the anti-reflective interpoly layer 48 to act as the interpoly layer of a flash memory stack.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims. Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. 112, sixth paragraph, unless the element is expressly recited using the phrase "means for."

What is claimed:

1. A flash memory device, comprising:
   a. a substrate;
   b. at least one core stack, wherein the at least one core stack comprises:
      (1) a tunnel oxide layer on the substrate;
      (2) a first polysilicon layer on the tunnel oxide layer;
      (3) an anti-reflective interpoly layer atop and in contact with the first polysilicon layer, said anti-reflective interpoly layer having an index of refraction n and a thickness d and being configured for use with a light having a wavelength $\lambda_1$, such that d is an odd numbered multiple of approximately $\lambda_1/4n$; and
      (4) a transmissive second polysilicon layer on the anti-reflective interpoly layer;
   c. at least one source region adjacent to the at least one core stack; and
   d. at least one drain region adjacent to the at least one core stack.

2. The flash memory device, as recited in claim 1, wherein the at least one source region and the at least one drain region are formed by the method comprising the steps of:
   a. depositing a layer of photoresist over the substrate and the at least one core stack;
   b. illuminating the layer of photoresist with said light;
   c. transmitting some of the light through the transmissive second polysilicon layer;
   d. preventing the reflection of the light at the anti-reflective interpoly layer;
   e. removing part of the photoresist layer; and
   f. implanting a dopant into the substrate.

3. The flash memory device, as recited in claim 2, wherein the light has an integer number m wavelengths incident upon the anti-reflective interpoly layer, and wherein $$d \cong \frac{\left(m + \frac{1}{2}\right)\lambda_1}{2n},$$

where m=0, 1, 2 . . . .

4. The flash memory device, as recited in claim 1, wherein $$d \cong \frac{\lambda_1}{4n}.$$

5. The flash memory device, as recited in claim 1, wherein the anti-reflective interpoly layer is made of silicon oxynitride (SiON).

6. The flash memory device, as recited in claim 5, wherein the thickness of the anti-reflective interpoly layer is between about 300 to 400 Å thick.

7. The flash memory device, as recited in claim 2, wherein the step of depositing the layer of photoresist, deposits the photoresist onto a surface of the transmissive second polysilicon layer.

* * * * *